United States Patent
Schoenmakers et al.

(10) Patent No.: US 11,861,817 B2
(45) Date of Patent: Jan. 2, 2024

(54) METHOD IMPLEMENTED BY A DATA PROCESSING APPARATUS, AND CHARGED PARTICLE BEAM DEVICE FOR INSPECTING A SPECIMEN USING SUCH A METHOD

(71) Applicant: FEI Company, Hillsboro, OR (US)

(72) Inventors: Remco Schoenmakers, Eindhoven (NL); Maurice Peemen, Eindhoven (NL); Pavel Potoček, Eindhoven (NL)

(73) Assignee: FEI Company, Hillsboro, OR (US)

( * ) Notice: Subject to any disclaimer, the term of this patent is extended or adjusted under 35 U.S.C. 154(b) by 470 days.

(21) Appl. No.: 17/235,117

(22) Filed: Apr. 20, 2021

(65) Prior Publication Data
US 2021/0327677 A1 Oct. 21, 2021

(30) Foreign Application Priority Data
Apr. 20, 2020 (EP) .................................. 20170443

(51) Int. Cl.
*H01J 37/28* (2006.01)
*G06K 9/00* (2022.01)
(Continued)

(52) U.S. Cl.
CPC .......... *G06T 7/0002* (2013.01); *G06V 20/693* (2022.01); *H01J 37/28* (2013.01);
(Continued)

(58) Field of Classification Search
CPC ................ G06V 20/693; G06T 7/0002; G06T 2207/30168; G06T 2207/10061;
(Continued)

(56) References Cited

U.S. PATENT DOCUMENTS

2016/0217555 A1* 7/2016 Ertel ................... G01R 33/5608
2020/0018944 A1* 1/2020 Fang .................... G06V 20/695
(Continued)

OTHER PUBLICATIONS

Nikhil B: Image Data Pre-Processing for Neural Networks—Becoming Human: Artificial Intelligence Magazine, Sep. 11, 2017 (Sep. 11, 2017), pp. 1-6, https://becominghuman.ai/image-data-pre-processing-for-neural-networks-498289068258.
(Continued)

*Primary Examiner* — Sang H Nguyen
(74) *Attorney, Agent, or Firm* — Denton W. McAlister; Thomas F. Cooney

(57) ABSTRACT

The invention relates to a method implemented by a data processing apparatus, comprising the steps of receiving an image; providing a set-point for a desired image quality parameter of said image; and processing said image using an image analysis technique for determining a current image quality parameter of said image. In the method, the current image quality parameter is compared with said desired set-point. Based on said comparison, a modified image is generated by using an image modification technique. The generating comprises the steps of improving said image in terms of said image quality parameter in case said current image quality parameter is lower than said set-point; and deteriorating said image in terms of said image quality parameter in case said current image quality parameter exceeds said set-point. The modified image is then output.

20 Claims, 5 Drawing Sheets

(51) Int. Cl.
*G06K 9/32* (2006.01)
*G06K 9/03* (2006.01)
*G06T 7/00* (2017.01)
*G06V 20/69* (2022.01)

(52) U.S. Cl.
CPC ............... *G06T 2207/10061* (2013.01); *G06T 2207/20084* (2013.01)

(58) Field of Classification Search
CPC ............ G06T 2207/20084; H01J 37/28; H01J 37/222; H01J 2237/28
See application file for complete search history.

(56) References Cited

U.S. PATENT DOCUMENTS

2020/0074610 A1\* 3/2020 Pu ........................... G06T 5/002
2020/0074611 A1\* 3/2020 Dou ......................... G06T 7/74

OTHER PUBLICATIONS

Extended European Search Report dated Sep. 25, 2020, for priority EP Application No. 20170443.4, filed Apr. 20, 2020.

\* cited by examiner

METHOD IMPLEMENTED BY A DATA PROCESSING APPARATUS, AND CHARGED PARTICLE BEAM DEVICE FOR INSPECTING A SPECIMEN USING SUCH A METHOD

FIELD OF THE INVENTION

The invention relates to a method implemented by a data processing apparatus. The invention further relates to a charged particle beam device for inspecting a specimen using such a method.

BACKGROUND OF THE INVENTION

Charged particle microscopy is a well-known and increasingly important technique for imaging microscopic objects, particularly in the form of electron microscopy. Historically, the basic genus of electron microscope has undergone evolution into a number of well-known apparatus species, such as the Transmission Electron Microscope (TEM), Scanning Electron Microscope (SEM), and Scanning Transmission Electron Microscope (STEM), and also into various sub-species, such as so-called "dual-beam" apparatus (e.g. a FIB-SEM), which additionally employ a "machining" Focused Ion Beam (FIB), allowing supportive activities such as ion-beam milling or Ion-Beam-Induced Deposition (IBID), for example. The skilled person will be familiar with the different species of charged particle microscopy.

In an SEM, irradiation of a sample by a scanning electron beam precipitates emanation of "auxiliary" radiation from the sample, in the form of secondary electrons, backscattered electrons, X-rays and cathodoluminescence (infrared, visible and/or ultraviolet photons). One or more components of this emanating radiation may be detected and used for sample analysis.

In a TEM, a beam of electrons is transmitted through a specimen to form an image from the interaction of the electrons with the sample as the beam is transmitted through the specimen. The image is then magnified and focused onto an imaging device, such as a fluorescent screen, a layer of photographic film, or a sensor such as a scintillator attached to a charge-coupled device (CCD). The scintillator converts primary electrons in the microscope to photons so that the CCD is able to detect it.

Charged particle microscopy may yield images of a sample to be studied. It is often required that the obtained images are to be processed. Said processing may comprise analyzing and/or manipulating an acquired image. For example, in SEM images of cell membranes of brain tissue it is desirable that a segmentation technique is performed on the images. For this task, an Artificial Neural Network (ANN) and/or Convolutional Neural Network (CNN) may be used. Although reasonably robust against different imaging conditions, still the segmentation quality drops if the data is noisier, has less focus, or is in some other way affected by inappropriate instrument conditions. This is undesirable of course as it may lead to subsequent errors, including wrong medical decisions.

One way of overcoming this degradation in analysis and/or manipulation results, is by retraining the network using the new conditions to account for these variations. However, that poses a significant problem if the network is in a production (customer) environment, where network retraining is often not a valid option as retraining is expensive due to computation time and often requires expert input for good labels.

Thus, one of the biggest challenges for ANNs and CNNs for use in image processing remains the fact that it is highly dependent on the stability of the imaging conditions and/or imaging parameters.

SUMMARY

It is therefore an object of the present invention to provide a method that can be used to overcome one or more of the drawbacks of the use of ANN and/or CNN in processing of an image.

To this end, a method implemented by a data processing apparatus is provided. The method as defined herein comprises the steps of receiving an image, providing a set-point for a desired image quality parameter of said image and processing said image using an image analysis technique for determining a current image quality parameter of said image. Then, the current image quality parameter is compared with said desired set-point. In other words, an image is provided and analysed for determining an image-related parameter, which is then checked to see if it matches a desired quality. Based on the results of said comparison, a modified image is generated by using an image modification technique. This image modification technique may comprise the use of an ANN and/or CNN.

As defined herein, said step of generating the modified image comprises the steps of improving said image in terms of said image quality parameter in case said current image quality parameter is lower than said set-point; and deteriorating said image in terms of said image quality parameter in case said current image quality parameter exceeds said set-point. In other words, based on the results of the comparison, either one of two actions is possible. In the first case, the image quality is lower than a desired value. In this case the image is improved by using the image modification technique to ensure that the image quality of the modified image is improved. In the second case, the image quality is higher than a desired value. In this case the image is deteriorated on purpose by using the image modification technique, to ensure that the image quality of the modified image is, in fact, lowered. As defined herein, the modified image is then output and analysed by an ANN and/or CNN. It follows from the above that the corresponding ANN and/or CNN that is used for the analysis is trained on an image set, wherein each of the images in the image set substantially has the desired image quality parameter.

As an example, the method as defined herein may comprise the step of providing a substantially noise-less image, and the method as defined herein may comprise the step of deteriorating said image by adding noise to said image. In general, one or more of the following may be done on what can be considered to be a high-quality image: the resolution may be lowered, the color depth may be decreased, the dynamic range may be lowered, focus may be deteriorated, sharpness may be lessened, directional blur may be added, contrast may be lowered, and white balance may be adjusted. Similarly, one or more of the following may be done on what can be considered to be a low-quality image: the resolution may be increased, the color depth may be increased, the dynamic range may be increased, focus may be improved, sharpness may be increased, directional blur may be removed, contrast may be increased, and white balance may be adjusted. The high-quality image is, in this sense, degraded to a medium-quality image, and the low-quality image is improved to a medium-quality image as well. The medium-quality image can then be analysed by a ANN and/or CNN, wherein said ANN and/or CNN was substantially trained on medium-quality images to begin with.

The method may be performed on a plurality of images. Incoming images may be transformed into images having targeted properties that may be pre-defined, wherein the targeted properties correspond to more moderate image quality settings. Incoming images that differ in quality, for example as they are made with different settings, are transformed to images that have similar, more moderate properties. This includes the steps of improving some images, and expressly deteriorating others. The final set of modified images has comparable image quality parameters and can be processed in a more easy and effective way. With this, the object is achieved.

As defined herein, the modified image is further analysed using an ANN and/or a CNN. The method as defined herein allows all images to be transformed into "medium quality" images that the ANN and/or CNN was trained on. Thus, by providing medium quality images, the variance of different input data to the ANN and/or CNN is reduced. Inventors realized that instead of always improving the received images (e.g. by making them better in terms of less noise, better focus, etc.) it is actually advantageous to introduce steps that make the images "worse", as it allows a significantly simpler operation to be used compared to increasing the image quality. This has as a beneficial consequence that the training data need not consist of the best possible images. Instead, the network can be trained with "medium quality" images, and the method as defined herein can be used to transform any subsequently acquired images to the known conditions that the original network was trained on. As described above this includes either improving or reducing image quality before providing the images to the ANN and/or CNN. In this way, proper operation of the ANN and/or CNN is guaranteed without the need for retraining of the primary NN.

The method as defined herein removes the necessity of retraining neural networks in the field. Instead, the neural network may be trained on a certain type of image, which may include images having more moderate image quality properties instead of images having excellent image quality properties. Then, the method as described above may be used to transform incoming images to modified images that are suitable for said neural network, and the neural network is able to process these images in a desired manner. As an extra benefit, in case it is found that the transformed or modified images are not sufficiently processed by the neural network, the image manipulation technique used in the step of generating a modified image may be altered. It is relatively easy and effective to modify the image manipulation technique to ensure that the modified images can be processed by the neural network, and this alleviates the necessity of retraining the neural network. Hence, existing ANN and/or CNN can still be used by transforming the images that are input into the ANN and/or CNN, instead of retraining the network. This is a great advantage, as no new training data or labels need to be collected and the image receiving NN, which may be highly complicated and deployed in an embedded system that may be hard to retrain, may thus remain unchanged.

It is noted that in the method as defined herein, the transforming includes both enhancing and degrading incoming images. The enhancing and degrading is with respect to one or more image parameters, which image parameters may include resolution, color depth, dynamic range, focus, sharpness, directional blur, contrast, white balance, and noise. Other image quality parameters are conceivable as well. The image modification technique used in the method is able to enhance and deteriorate the received image for one or more of the parameters stated above. Those skilled in the art will be familiar with suitable parameters and algorithms and the like that are used in these image modification techniques.

As already stated above, it is desirable that the set-point for said desired image quality parameter corresponds to a moderate image quality parameter value.

The method may comprise the further step of analysing the modified image. Said analysing may comprise the step of using an artificial neural network (ANN) and/or a convolutional neural network (CNN).

The analysing may comprise the identification of one or more objects in said image.

The images may be provided to the data processing apparatus in a number of ways. The images may be retrieved from a non-transitory computer readable medium. The images may be retrieved from a cloud computing network. The images may be obtained by a camera device that is connected to the data processing apparatus.

In an embodiment, said image is obtained by a microscope, in particular a charged particle microscope. The charged particle microscope may be an electron microscope.

According to an aspect, a non-transitory computer readable medium is provided, wherein said non-transitory computer readable medium has stored thereon software instructions that, when executed by a data processing apparatus, cause the data processing apparatus to execute the method as defined herein.

According to an aspect, a charged particle beam device for inspection of a specimen is provided, comprising:

A specimen holder for holding a specimen;
A source for producing a beam of charged particles;
An illuminator for focusing said charged particle beam onto said specimen;
A detector for detecting a flux of radiation emanating from the specimen in response to said irradiation by said charged particle beam; and
A data processing apparatus.

As defined herein, the charged particle beam device is arranged for executing the method as defined herein.

The data processing apparatus may be connected to the detector directly and receive data and/or images from said detector in a direct manner. An intermediate connection, for example by means of an additional apparatus in between the detector and the processing apparatus is possible as well. It is conceivable, for example, that the charged particle beam device comprises a controller that is arranged for operating at least part of the charged particle beam device. This controller may be connected, or at least connectable, to the detector and to the data processing apparatus and may be arranged for forwarding (image containing) data from the detector to the processing apparatus. The controller may be arranged for processing the data emanating from the detector, or may be arranged for forwarding raw data to the data processing apparatus. Once the data is received, the data processing apparatus will be able to execute the method as defined herein. In an embodiment, the controller comprises said data processing apparatus.

According to an aspect, a data processing apparatus is provided that is arranged for executing the method as defined herein.

BRIEF DESCRIPTION OF THE DRAWINGS

The invention will now be elucidated in more detail on the basis of exemplary embodiments and the accompanying schematic drawings, in which:

FIG. 1 (not to scale) is a highly schematic depiction of an embodiment of a charged-particle microscope M according to an embodiment of the invention. More specifically, it shows an embodiment of a transmission-type microscope M, which, in this case, is a TEM/STEM (though, in the context of the current invention, it could just as validly be a SEM (see FIG. 2), or an ion-based microscope, for example). In FIG. 1, within a vacuum enclosure 2, an electron source 4 produces a beam B of electrons that propagates along an electron-optical axis B' and traverses an electron-optical illuminator 6, serving to direct/focus the electrons onto a chosen part of a specimen S (which may, for example, be (locally) thinned/planarized). Also depicted is a deflector 8, which (inter alia) can be used to effect scanning motion of the beam B.

Figure 1:
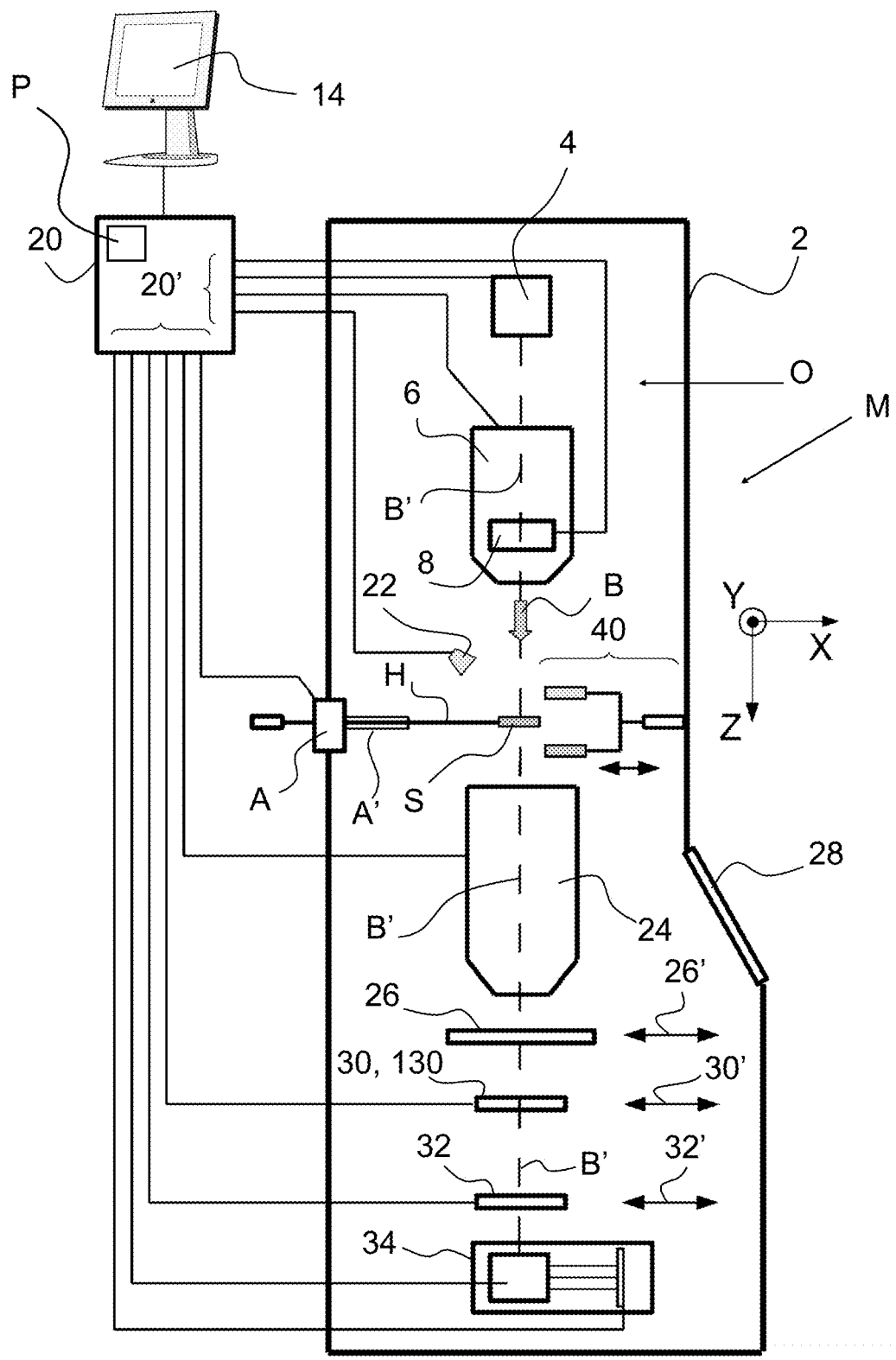
FIG. 1—shows a longitudinal cross-sectional view of a charged particle microscope according to a first embodiment of the invention.

The specimen S is held on a specimen holder H that can be positioned in multiple degrees of freedom by a positioning device/stage A, which moves a cradle A' into which holder H is (removably) affixed; for example, the specimen holder H may comprise a finger that can be moved (inter alia) in the XY plane (see the depicted Cartesian coordinate system; typically, motion parallel to Z and tilt about X/Y will also be possible). Such movement allows different parts of the specimen S to be illuminated/imaged/inspected by the electron beam B traveling along axis B' (in the Z direction) (and/or allows scanning motion to be performed, as an alternative to beam scanning). If desired, an optional cooling device (not depicted) can be brought into intimate thermal contact with the specimen holder H, so as to maintain it (and the specimen S thereupon) at cryogenic temperatures, for example.

The electron beam B will interact with the specimen S in such a manner as to cause various types of "stimulated" radiation to emanate from the specimen S, including (for example) secondary electrons, backscattered electrons, X-rays and optical radiation (cathodoluminescence). If desired, one or more of these radiation types can be detected with the aid of analysis device 22, which might be a combined scintillator/photomultiplier or EDX or EDS (Energy-Dispersive X-Ray Spectroscopy) module, for instance; in such a case, an image could be constructed using basically the same principle as in a SEM. However, alternatively or supplementally, one can study electrons that traverse (pass through) the specimen S, exit/emanate from it and continue to propagate (substantially, though generally with some deflection/scattering) along axis B'. Such a transmitted electron flux enters an imaging system (projection lens) 24, which will generally comprise a variety of electrostatic/magnetic lenses, deflectors, correctors (such as stigmators), etc. In normal (non-scanning) TEM mode, this imaging system 24 can focus the transmitted electron flux onto a fluorescent screen 26, which, if desired, can be retracted/withdrawn (as schematically indicated by arrows 26') so as to get it out of the way of axis B'. An image (or diffractogram) of (part of) the specimen S will be formed by imaging system 24 on screen 26, and this may be viewed through viewing port 28 located in a suitable part of a wall of enclosure 2. The retraction mechanism for screen 26 may, for example, be mechanical and/or electrical in nature, and is not depicted here.

As an alternative to viewing an image on screen 26, one can instead make use of the fact that the depth of focus of the electron flux leaving imaging system 24 is generally quite large (e.g. of the order of 1 meter). Consequently, various other types of analysis apparatus can be used downstream of screen 26, such as:

- TEM camera 30. At camera 30, the electron flux can form a static image (or diffractogram) that can be processed by controller/processor 20 and displayed on a display device 14, such as a flat panel display, for example. When not required, camera 30 can be retracted/withdrawn (as schematically indicated by arrows 30') so as to get it out of the way of axis B'.
- STEM camera 32. An output from camera 32 can be recorded as a function of (X,Y) scanning position of the beam B on the specimen S, and an image can be constructed that is a "map" of output from camera 32 as a function of X,Y. Camera 32 can comprise a single pixel with a diameter of e.g. 20 mm, as opposed to the matrix of pixels characteristically present in camera 30, although camera 32 can be an Electron Microscope Pixel Array Detector (EMPAD) as well. Moreover, camera 32 will generally have a much higher acquisition rate (e.g. $10^6$ points per second) than camera 30 (e.g. $10^2$ images per second). Once again, when not required, camera 32 can be retracted/withdrawn (as schematically indicated by arrows 32') so as to get it out of the way of axis B' (although such retraction would not be a necessity in the case of a donut-shaped annular dark field camera 32, for example; in such a camera, a central hole would allow flux passage when the camera was not in use).
- As an alternative to imaging using cameras 30 or 32, one can also invoke spectroscopic apparatus 34, which could be an EELS module, for example.

It should be noted that the order/location of items 30, 32 and 34 is not strict, and many possible variations are conceivable. For example, spectroscopic apparatus 34 can also be integrated into the imaging system 24.

In the embodiment shown, the microscope M further comprises a retractable X-ray Computed Tomography (CT) module, generally indicated by reference 40. In Computed Tomography (also referred to as tomographic imaging) the source and (diametrically opposed) detector are used to look through the specimen along different lines of sight, so as to acquire penetrative observations of the specimen from a variety of perspectives.

Note that the controller (computer processor) 20 is connected to various illustrated components via control lines (buses) 20'. This controller 20 can provide a variety of functions, such as synchronizing actions, providing setpoints, processing signals, performing calculations, and displaying messages/information on a display device (not depicted). Needless to say, the (schematically depicted) controller 20 may be (partially) inside or outside the enclosure 2, and may have a unitary or composite structure, as desired. The controller comprises, as shown in this embodiment, a data processing apparatus P that is arranged for carrying out the method as defined herein.

The skilled artisan will understand that the interior of the enclosure 2 does not have to be kept at a strict vacuum; for example, in a so-called "Environmental TEM/STEM", a background atmosphere of a given gas is deliberately introduced/maintained within the enclosure 2. The skilled artisan will also understand that, in practice, it may be advantageous to confine the volume of enclosure 2 so that, where possible, it essentially hugs the axis B', taking the form of a small tube (e.g. of the order of 1 cm in diameter) through which the employed electron beam passes, but widening out to accommodate structures such as the source 4, specimen holder H, screen 26, camera 30, camera 32, spectroscopic apparatus 34, etc.

Figure 2:
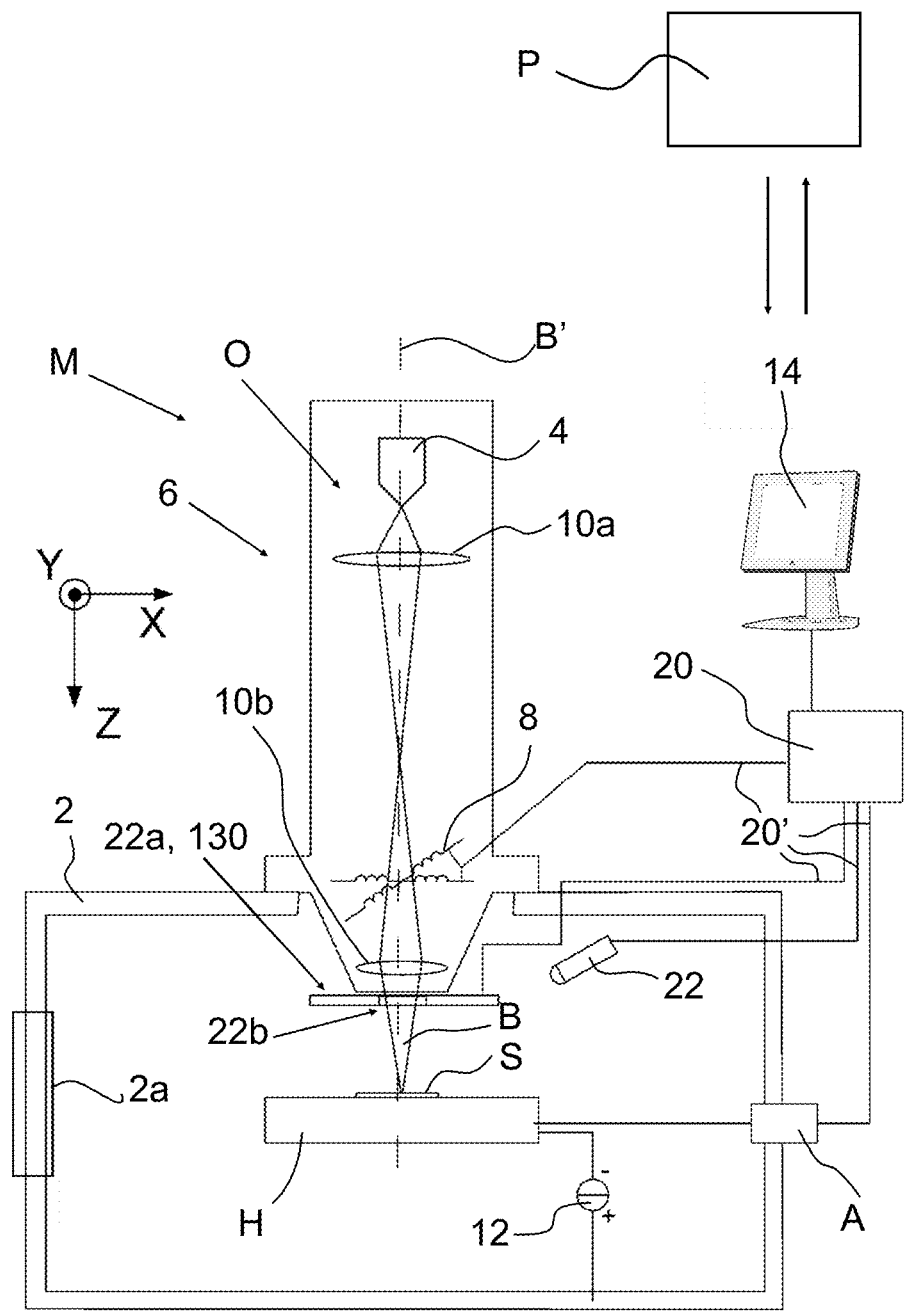
FIG. 2—shows a longitudinal cross-sectional view of a charged particle microscope according to a second embodiment of the invention.

Now referring to FIG. 2, another embodiment of an apparatus according to the invention is shown. FIG. 2 (not to scale) is a highly schematic depiction of a charged-particle microscope M according to the present invention; more specifically, it shows an embodiment of a non-transmission-type microscope M, which, in this case, is a SEM (though, in the context of the current invention, it could just as validly be an ion-based microscope, for example). In the Figure, parts which correspond to items in FIG. 1 are indicated using identical reference symbols, and will not be separately discussed here. Additional to FIG. 1 are (inter alia) the following parts:

- 2a: A vacuum port, which may be opened so as to introduce/remove items (components, specimens) to/from the interior of vacuum chamber 2, or onto which, for example, an ancillary device/module may be mounted. The microscope M may comprise a plurality of such ports 2a, if desired;
- 10a, 10b: Schematically depicted lenses/optical elements in illuminator 6;
- 12: A voltage source, allowing the specimen holder H, or at least the specimen S, to be biased (floated) to an electrical potential with respect to ground, if desired;
- 14: A display, such as a FPD or CRT;
- 22a, 22b: A segmented electron detector 22a, comprising a plurality of independent detection segments (e.g. quadrants) disposed about a central aperture 22b (allowing passage of the beam B). Such a detector can, for example, be used to investigate (the angular dependence of) a flux of output (secondary or backscattered) electrons emerging from the specimen S.

Here also, a controller 20 is present. The controller is connected to the display 14, and the display 14 may be connectable to a data processing apparatus P that is arranged for carrying out the method as defined herein. In the embodiment shown, the data processing apparatus P is a separate structure that does not form part of the controller, and does not even form part of the microscope P. The data processing apparatus P may be local or cloud based, and is in principle not limited to any location.

Figure 3:
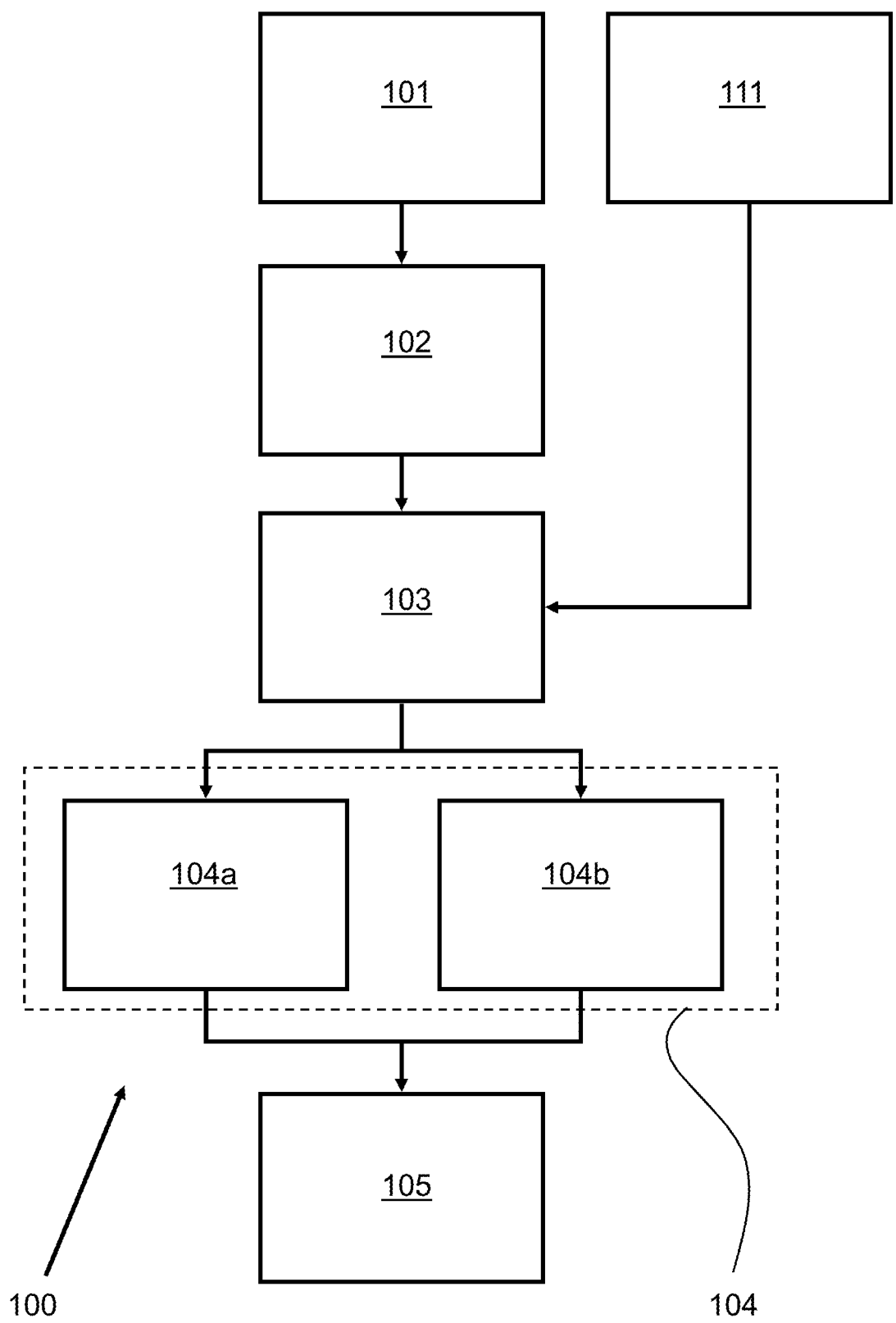
FIG. 3—a flow chart of a first embodiment of the method as defined herein.

Now turning to FIG. 3, a flow chart of the method 100 as defined herein is shown. The method, which is implemented by a data processing apparatus P, comprises the steps of:
- receiving 101 an image;
- providing 111 a set-point for a desired image quality parameter of said image;
- processing 102 said image using an image analysis technique for determining a current image quality parameter of said image 103;
- comparing 103 said current image quality parameter with said desired set-point 111; and
- generating 104, based on said comparison, a modified image by using an image modification technique, wherein said generating 104 comprises the steps of:
    - Improving 104a said image in terms of said image quality parameter in case said current image quality parameter is lower than said set-point; and
    - Deteriorating 104b said image in terms of said image quality parameter in case said current image quality parameter exceeds said set-point; and
- outputting 105 said modified image.

Said step of generating 104 a modified image may comprise the step of using an artificial neural network (ANN) and/or a convolutional neural network (CNN). Other image modification techniques may be used as well.

Figure 4:
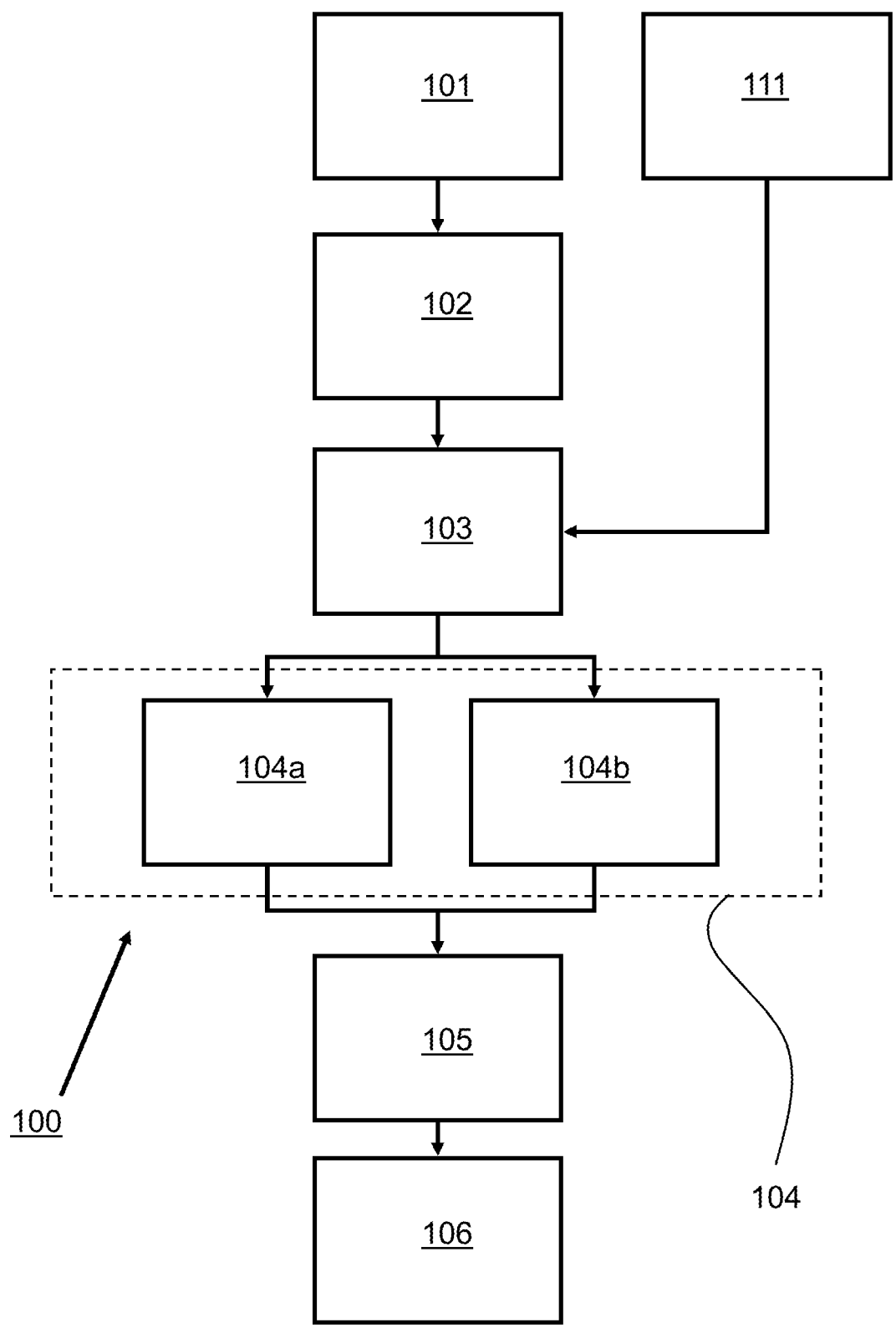
FIG. 4—a flow chart of a further embodiment of the method as defined herein.

FIG. 4 shows a further embodiment of the method as defined herein. This embodiment is similar to the embodiment shown in FIG. 3 but includes the further step of analysing 106 the modified image. The analysing can be done using an ANN and/or CNN, and may include segmentation of the modified image, for example, and/or identifying of one or more objects in said modified image. Analysis may include image reconstruction techniques as well.

The image received by the data processing apparatus P may be provided by a charged particle microscope M as shown in FIG. 1 or FIG. 2. Other ways of providing images to the data processing apparatus P are conceivable as well.

Figure 5:
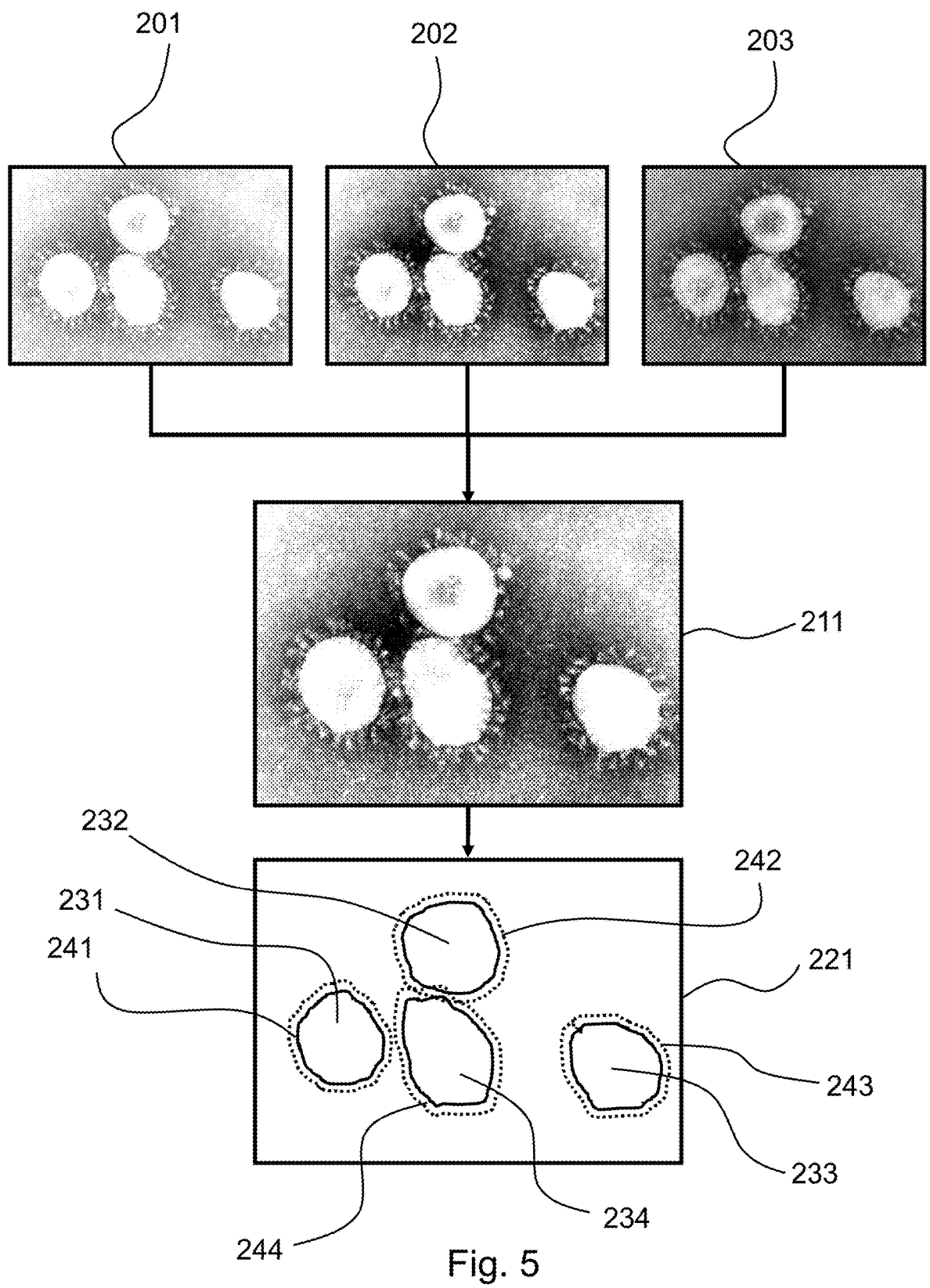
FIG. 5—an illustration of a possible method of analyzing and processing images with the method as defined herein.

FIG. 5 shows an example of how the method as defined herein operates, in an example. Here, three input images 201-203 are shown. The left image 201 has a low image quality (illustrated by lower contrast, lower sharpness, low detail, which can also be referred to as data where desired information can hardly be extracted with standard image processing techniques), the middle image 202 has an medium image quality (medium contrast, medium sharpness and medium details, which may also be referred to as data of sufficient quality to extract desired information in a complicated way with standard image processing techniques), and the right image 203 has a high image quality (high contrast, high sharpness, and high detail, which may also be referred to as data of sufficient quality to easily extract desired information with standard image processing techniques). The method as defined herein is able to determine one or more image parameters from the input images 201-203, and then compare these one or more image parameters to a desired, targeted image quality parameter. In the method as defined herein, the desired image quality parameter corresponds to a targeted, more moderate image quality parameter value. Each of the images 201-203 is processed by the data processing apparatus and compared to a desired quality, and then an image modification technique is applied to generate an image that has the targeted image quality, for example. In the embodiment shown, the method is arranged for transforming the left input image 201 to a moderate quality image 211 by increasing the quality with respect to contrast, sharpness and detail. The method is also arranged for transforming the right input image 203 to a moderate quality image 211 by deteriorating the quality with respect to contrast, sharpness and detail. For the middle image 202, where the determined quality parameter may not deviate much from the desired quality parameter, it is conceivable that no image transformation technique is applied. Hence, in an embodiment, the method comprises the step of maintaining the input image 202 as the output image 211 in case the determined image quality parameter is equal to, or within a limited threshold of, said desired image quality parameter. In other embodiments, the middle image 202 may nevertheless be transformed with respect to said quality parameter. In any event, the input images 201-203 will be processed, and may be improved, deteriorated, and/or passed through, eventually leading to (virtually) the same image 211.

Once the output image 211 is formed, a further analysis may be performed on the output image 211, using a ANN and/or CNN, for example. In FIG. 5, the ANN and/or CNN may be used to identify particles 231-234 and corresponding regional boundaries 241-244. It is noted that this can be done for each of the three input images 201-203. The resulting output image 211 should not be considered to be an averaged image 211 of the three input images 201-203.

It is noted that the method as defined herein is described in reference to images. The method as defined herein is in principle applicable to any 2D or 3D representation. The images as defined herein may relate in one embodiment to images that are obtainable by charged particle microscopy, including EM images, BSE images, spectral images such as EELS, etcetera.

The method has been described above by means of several non-limiting examples. The desired protection is determined by the appended claims.

The invention claimed is:

1. A method implemented by a data processing apparatus, comprising:
   receiving an image;
   providing a set-point for a desired image quality parameter of said image;
   processing said image using an image analysis technique for determining a current image quality parameter of said image;
   comparing said current image quality parameter with said desired set-point, and generating, based on said comparison, a modified image by using an image modification technique, wherein said generating comprises the steps of:
   improving said image in terms of said image quality parameter in case said current image quality parameter is lower than said set-point; and
   deteriorating said image in terms of said image quality parameter in case said current image quality parameter exceeds said set-point; and
   outputting and analysing said modified image, wherein said analysing comprises the step of using an artificial neural network (ANN) and/or a convolutional neural network (CNN) on said modified image.

2. Method according to claim 1, wherein said image modification technique comprises the step of using an artificial neural network (ANN) and/or a convolutional neural network (CNN).

3. Method according to claim 1, wherein said set-point for said desired image quality parameter corresponds to a moderate image quality parameter value.

4. Method according to claim 1, wherein said image quality parameter comprises one or more parameters chosen from the group consisting of: resolution, color depth, dynamic range, focus, sharpness, directional blur, contrast, white balance, and noise.

5. Method according to claim 1, wherein said set-point corresponds to a medium quality of said image parameter.

6. Method according to claim 1, wherein said step of analysing comprises the identification of one or more objects in said image.

7. Method according to claim 1, wherein said image is obtained by a microscope, in particular a charged particle microscope.

8. Method according to claim 1, wherein said image quality parameter consists of one or more parameters chosen from the group consisting of: image resolution, image focus, and image noise.

9. A non-transitory computer readable medium having stored thereon software instructions that, when executed by a data processing apparatus, cause the data processing apparatus to execute the method according to claim 1.

10. A charged particle beam device for inspection of a specimen, comprising:
    a specimen holder for holding a specimen;
    a source for producing a beam of charged particles;
    an illuminator for focusing said charged particle beam onto said specimen;
    a detector for detecting a flux of radiation emanating from the specimen in response to said irradiation by said charged particle beam; and
    a data processing apparatus coupled to at least the detector, and the data processing apparatus including code that, when executed by the data processing apparatus, causes the data processing apparatus to:
    receive an image;
    provide a set-point for a desired image quality parameter of said image;
    process said image using an image analysis technique to determine a current image quality parameter of said image;
    compare said current image quality parameter with said set-point, and generate, based on said comparison, a modified image based on an image modification technique, wherein to generate a modified image comprises:
    improve said image in terms of said image quality parameter in case said current image quality parameter is lower than said set-point; and
    deteriorate said image in terms of said image quality parameter in case said current image quality parameter exceeds said set-point; and
    output and analyse said modified image, wherein said analysing comprises the step of using an artificial neural network (ANN) and/or a convolutional neural network (CNN) on said modified image.

11. A method comprising:
    providing a set-point for a desired image quality parameter;
    processing an image using an image analysis technique for determining a current image quality parameter of said image;
    comparing said current image quality parameter with said set-point;
    based on the image quality parameter being lower than said set-point, improving said image;
    based on the image quality parameter being higher than said set-point, deteriorating said image; and
    outputting and analysing said modified image, wherein said analysing comprises the step of using an artificial neural network (ANN) and/or a convolutional neural network (CNN) on said modified image.

12. The method of claim 11, wherein improving said image includes improving said image in terms of said image quality parameter.

13. The method of claim 11, wherein deteriorating said image includes deteriorating said image in terms of said image quality parameter.

14. The method of claim 11, wherein said image modification technique comprises the step of using an artificial neural network (ANN) and/or a convolutional neural network (CNN).

15. The method of claim 11, wherein said set-point for said image quality parameter corresponds to a moderate image quality parameter value.

16. The method of claim 11, wherein said image quality parameter comprises one or more parameters chosen from the group consisting of: resolution, color depth, dynamic range, focus, sharpness, directional blur, contrast, white balance, and noise.

17. The method of claim 11, wherein said set-point corresponds to a medium quality of said image parameter.

18. The method of claim 11, wherein said step of analysing comprises the identification of one or more objects in said image.

19. The method of claim 11, wherein said image is obtained by a microscope, in particular a charged particle microscope.

20. The method of claim 11, wherein said image quality parameter consists of one or more parameters chosen from the group consisting of: image resolution, image focus, and image noise.

* * * * *